(12) United States Patent
Kuo

(10) Patent No.: US 6,967,871 B1
(45) Date of Patent: Nov. 22, 2005

(54) REFERENCE SENSING CIRCUIT

(75) Inventor: Cheng-Hsiung Kuo, Jhubei (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 0 days.

(21) Appl. No.: 10/849,401

(22) Filed: May 19, 2004

(51) Int. Cl.$^7$ .............................................. G11C 16/06
(52) U.S. Cl. ............................ 365/185.2; 365/185.21; 365/185.18
(58) Field of Search ....................... 365/185.18, 185.2, 365/185.21, 189.09, 205, 207, 210

(56) References Cited

U.S. PATENT DOCUMENTS

| | | | |
|---|---|---|---|
| 6,411,549 B1 | 6/2002 | Pathak et al. ............ | 365/185.2 |
| 6,687,162 B1 * | 2/2004 | Hsueh et al. .......... | 365/185.21 |
| 6,768,677 B2 * | 7/2004 | Le et al. .................. | 365/185.2 |

* cited by examiner

*Primary Examiner*—Gene N. Auduong
(74) *Attorney, Agent, or Firm*—Duane Morris LLP

(57) ABSTRACT

A reference voltage generator circuit for nonvolatile memory devices is disclosed. The circuit has at least one sense amplifier bias reference voltage generator (SABRVG) for generating a reference voltage at a predetermined reference point that is coupled to a start-up bias reference voltage generator (SBRVG). It also includes a monitor reference voltage generator (MRVG) for generating a monitor reference voltage, and a comparison module for comparing the monitor reference voltage with the reference voltage to produce a start-up control signal, wherein the SBRVG enhances a changing speed of the reference voltage during a reading cycle of the nonvolatile memory and when the monitor reference and the reference voltages are matched, the start-up control signal stops the SBRVG from operating, thereby having the SABRVG maintain the reference voltage.

17 Claims, 6 Drawing Sheets

REFERENCE SENSING CIRCUIT

BACKGROUND OF INVENTION

The present disclosure relates generally to semiconductor devices, and more particularly to nonvolatile memory devices. Still more particularly, the present disclosure relates to reference voltage generator circuits and methods for controlling a reference voltage in nonvolatile memory devices.

Nonvolatile memory devices such as flash memory and electrically-erasable-programmable-read-only memory (EEPROM) utilize a plurality of internal memory arrays that can be programmed to last indefinitely. Additional control circuitry is embedded in these devices for a number of purposes, including reference voltage generation for sense amplifiers. However, it is understood by those skilled in the art that the embedded circuitries and the methods by which the said circuitries are embedded may vary from time to time, depending on the desired functionality of the memory device.

Typically, memory cells in a memory array are arranged along rows and columns. The gates of the cells along each row are connected together, thereby forming a word line. The drains of the cells along each column are connected together, thereby forming a bit line. The selection of a word line and a bit line determines which memory cell is selected.

Memory cells are typically programmed by tunneling electrons into a memory cell. The presence of a charge bias determines the value ("1" or "0") of the memory cell. Stored electrons can then be read electrically by detecting the resistance of the said memory cell, since the resistance of the said memory cell is dependent upon the magnitude of charge bias. By selecting the appropriate word line and bit line through a row address decoder and a column address decoder, respectively, the charge bias of the appropriate memory cell may be determined.

Because of variations in semiconductor memory designs and variations in the magnitude of tunneling under various programming setups, resistance often varies across different designs and setups. Therefore, a unique reference for a particular semiconductor memory design and setup is usually required such that it can be compared against the actual resistance in memory cells. The bit line signal for each memory cell is regenerated by a sense amplifier, which defines a "1" or a "0" of the said memory cell by determining whether the resistance of the said memory cell is above or below a reference resistance. This threshold resistance is stored in a "half-cell" whose resistance is usually midway between when a material is fully-resisted or lowly-resisted.

Since a reference voltage generator circuitry is responsible for all sense amplifiers across all bit lines in a memory block, as the width of bit line input/output (I/O) increases, capacitance loading across all bit lines will correspondingly increase. As such, the reference voltage generator circuitry, which generates the threshold voltage for all sense amplifiers, will experience a correspondingly large capacitance loading. During a reading cycle, the reference voltage generated by a bias reference voltage generator circuit needs to discharge. As capacitance loading increases, the time required to discharge before the reference voltage is said to be "ready" increases correspondingly. If the reference voltage is not "ready" before memory read operations begin, an erroneous reference voltage may be fed into the sense amplifier, which in turn may return an erroneous memory reading.

As flash memory and EEPROM applications call for wider I/O requirements, bit line capacitance load will correspondingly increase. This dramatic increase in capacitance load in turn requires any circuitry that generates a reference voltage to either increase its discharge speed, or be independent thereof.

Desirable in the art of semiconductor memory design are additional methods with which a better control of sense amplifier reference voltage in nonvolatile memories can be achieved.

SUMMARY

In view of the foregoing, a reference voltage generator circuit for nonvolatile memory devices is disclosed. The circuit has at least one sense amplifier bias reference voltage generator (SABRVG) for generating a reference voltage at a predetermined reference point that is coupled to a start-up bias reference voltage generator (SBRVG). It also includes a monitor reference voltage generator (MRVG) for generating a monitor reference voltage, and a comparison module for comparing the monitor reference voltage with the reference voltage to produce a start-up control signal, wherein the SBRVG enhances a changing speed of the reference voltage during a reading cycle of the nonvolatile memory and when the monitor reference and the reference voltages are matched, the start-up control signal stops the SBRVG from operating, thereby having the MRVG maintain the reference voltage.

Various aspects and advantages will become apparent from the following detailed description, taken in conjunction with the accompanying drawings, illustrating the principles of the disclosure by way of examples.

DESCRIPTION

Figure 1:
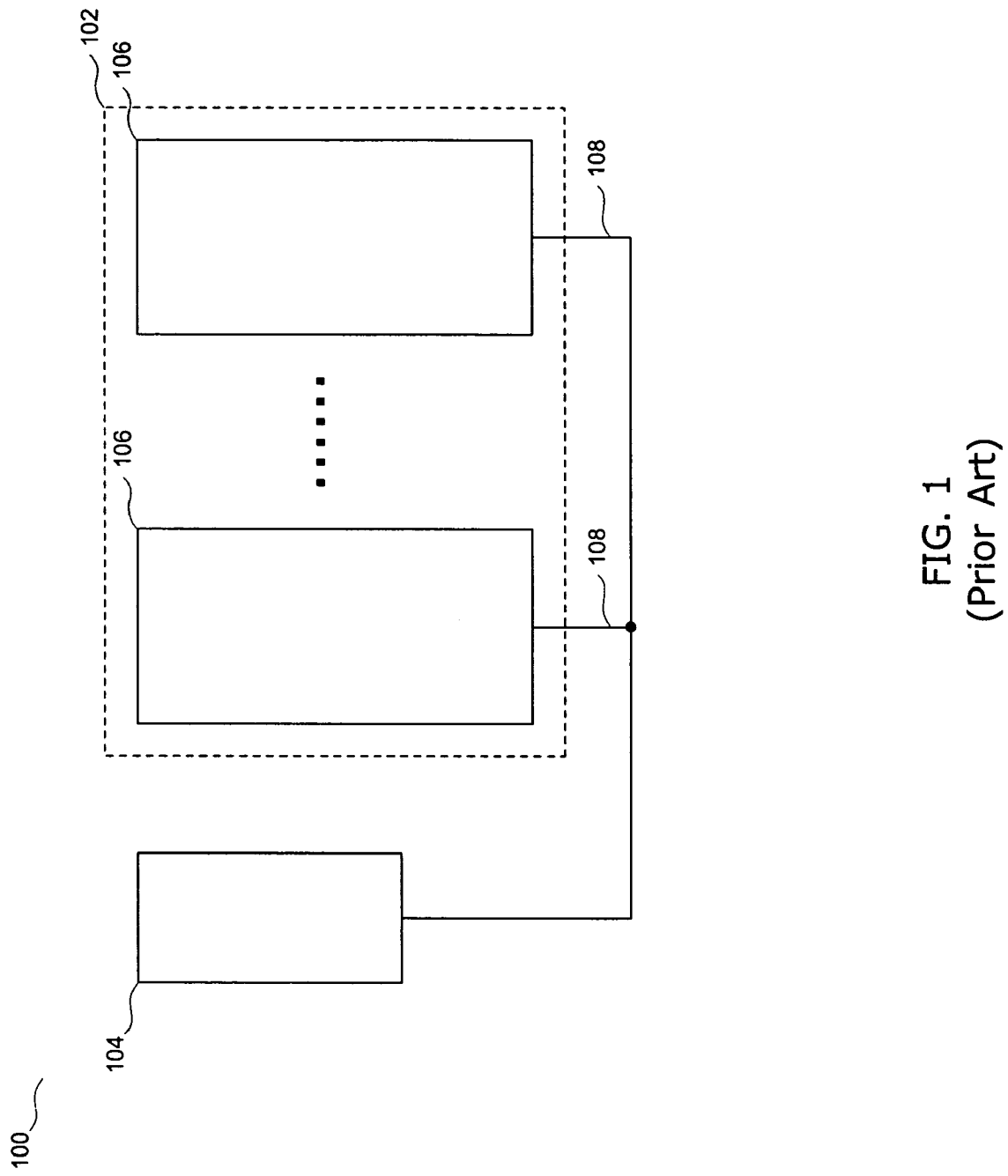
FIG. 1 illustrates a conventional memory device with a reference voltage generator and a memory array.

In the present disclosure, a memory device and a method to control sense amplifier reference voltage thereof is disclosed. As shown in FIG. 1, a conventional memory device 100 includes a memory array 102 and a reference voltage generator 104. The memory array 102 includes a plurality of memory modules or input/output (I/O) modules 106, each of which is connected, via a plurality of connections 108, to the reference voltage generator 104. Each I/O module 106 represents the selection mechanism for each bit line in the memory array 102. The reference voltage generator 104 generates an appropriate reference voltage that is compared to by an output from one of the pre-selected I/O modules 106.

Figure 2:
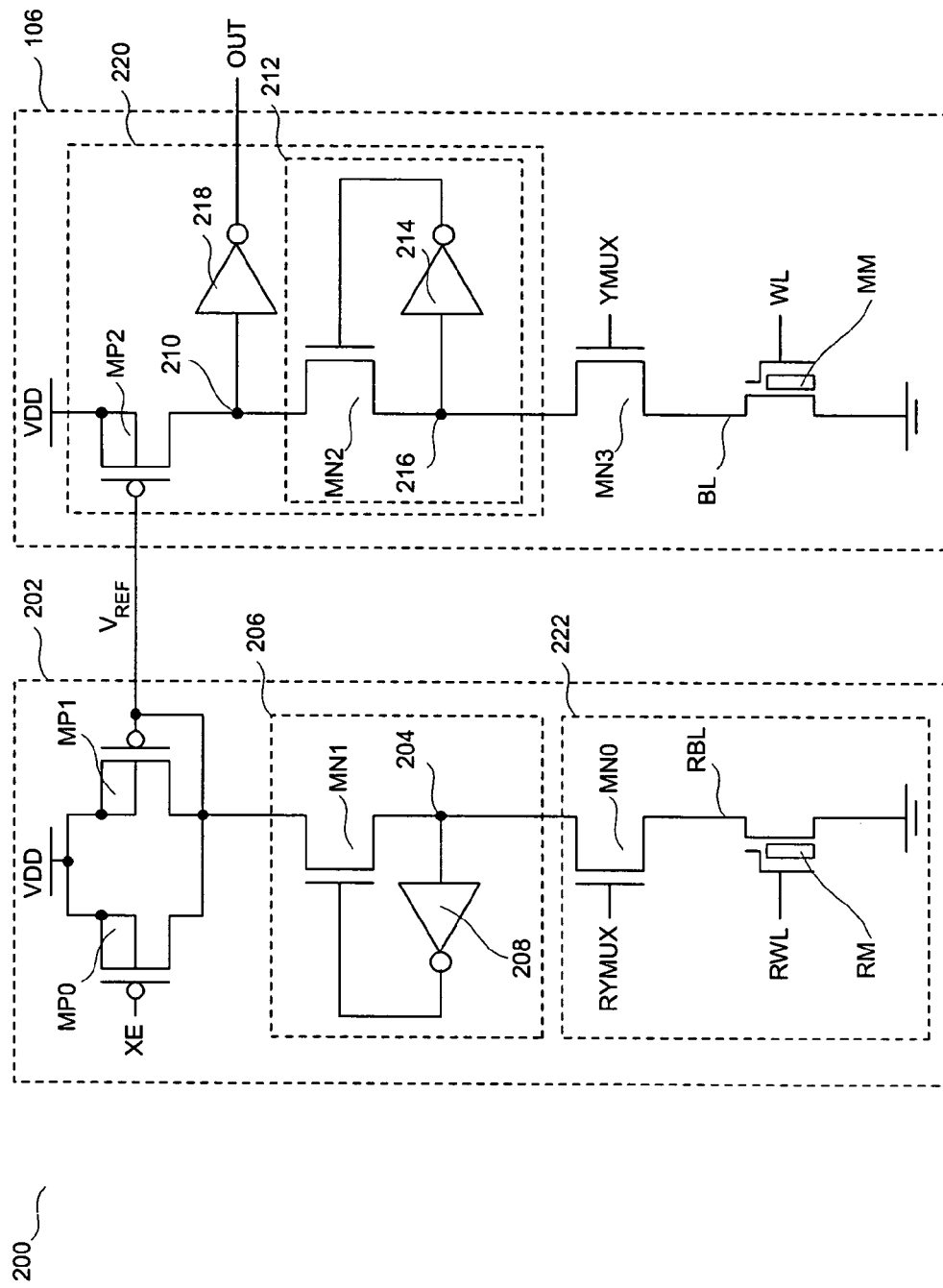
FIG. 2 illustrates a block diagram of a reference voltage generator with a bit line input/output (I/O) module as its load.

FIG. 2 presents a simplified schematic 200 illustrating how an I/O module 106 and a sense amplifier bias reference voltage generator (BRVG) 202 operate during I/O operations from a bit line containing a memory cell. The reference voltage generator 202 includes a reference memory cell RM, which is selected through the simultaneous selections of its corresponding reference wordline control RWL and its corresponding bit line. The reference bit line RBL is in turn selected by biasing the gate of an nMOS transistor MN0 with an appropriate bitline control signal RYMUX. When the appropriate bit and word lines are selected, the voltage at RBL is carried to a node 204. The BRVG 202 also includes pull-up pMOS transistors MP0 and MP1, whose sources are connected together, and further connected to VDD, and whose drains are connected together, and further connected to the gate of transistor MP1, whose voltage is a reference voltage $V_{REF}$. The drain of the transistor MP1 can be viewed as a reference node from which the reference voltage is produced.

The gate of transistor MP0 is connected to a control signal XE. Before XE is set to "1", $V_{REF}$ is equal to VDD because transistor MP0 conducts. The drains of both transistors MP0 and MP1 are connected to one end of a negative feedback module 206, which includes an inverter 208 and an NMOS transistor MN1. The other end of the negative feedback module 206 is the node 204. It is however understood by those skilled in the art that the negative feedback module 206 may be composed of other circuit elements, depending on overall design requirements and specifications. The negative feedback module 206 is used to clamp the bitline of the memory cell at a certain voltage level (e.g., in 0.25 um technology, it is around 1V).

As a load to the BRVG 202, the I/O module 106 includes a pMOS transistor MP2, whose source and gate are respectively connected to VDD and $V_{REF}$, and whose drain is connected to a node 210. Node 210 also connects to one end of a negative feedback module 212, which includes an inverter 214 and an nMOS transistor MN2. The other end of the negative feedback module 212 is a node 216, which is connected to the drain of an nMOS transistor MN3, whose source is further connected to a memory cell MM. Memory cell MM is selected by simultaneously selecting its corresponding wordline control signal WL and its corresponding bit line BL. The bit line BL is selected by biasing the gate of transistor MN3 with an appropriate bitline control signal YMUX. Node 210 is also connected to the input terminal of an inverter 218, whose output is the amplified output OUT. The combination of transistor MP2, the negative feedback module 212 and the inverter 218 can be interpreted collectively as a sense amplifier 220. The combination of transistor MN0, reference memory cell RM and line selection signals RWL and RYMUX can be interpreted collectively as a reference cell module 222 while MN3, MM and their control signals are referred to as a target memory cell module.

Typically, the reference voltage $V_{REF}$ is fed into the sense amplifier 220 to read out the data stored in a connected target memory cell. In one example, the reference memory cell RM is half-cell (assume a reference cell current Irm), while the memory cell MM is an erased cell (assuming cell current Ie, and Ie>Irm) or programmed cell (assumes cell current Ip, and Ip<Irm). When the sense amplifier is enabled, the nodes 204 and 216 will be clamped at a certain level (e.g., for devices using 0.25 um technology, it is around 1V) by the negative feedback modules 206 and 212, respectively. When RM is selected, RM will generate reference cell current Irm because negative feedback module 206 clamps the reference BL voltage RBL at 1V or less (since MN0 is a pass transistor so the voltage level of RBL is equal to node 204). Similarly, when MM is selected, MM will generate cell current I because negative feedback module 212 clamps the BL voltage at 1V or less (since MN3 is a pass transistor so the voltage level of BL is equal to node 216). Since PMOS MP1 and MP2 form a current mirror, Irm is copied from MP1 to MP2. If MM is an erased cell, I(I=Ie)>Irm. Node 210 will be gradually pulled down. Therefore, OUT is "high". If MM is a programmed cell, I (I=Ip)<Irm, Node 210 will be gradually pulled high, therefore, OUT is "low". By programming the resistance at memory cell MM relative to the resistance of the reference memory cell RM, memory information can be stored, and subsequently "read" by latching the output OUT. It is understood by those skilled in the art that there may e various methods to latch the output OUT. During normal circuit operation, Xe is set to "1". When Xe is set to "0", transistor MP0 conducts, thereby sending VDD to $V_{REF}$. Transistor MP2 does not conduct, thereby disabling the rest of the circuit, since transistors MP1 and MP2 no longer conduct.

In a reading cycle of the memory cell, especially at the beginning of the reading cycle, the bias reference voltage $V_{REF}$ maintained by the regular bias reference voltage generator 202 needs to discharge quickly for the operation. As more memory cells are coupled to the bias reference voltage generator 202, it tends to discharge slower than desired due to the excessive capacitive loads coupled to it. The present disclosure thus provide a mechanism using a startup reference voltage generator coupled to the regular bias reference voltage generator 202 for enhancing the discharge of $V_{REF}$ so that it can be ready for the reading operation.

Figure 3:
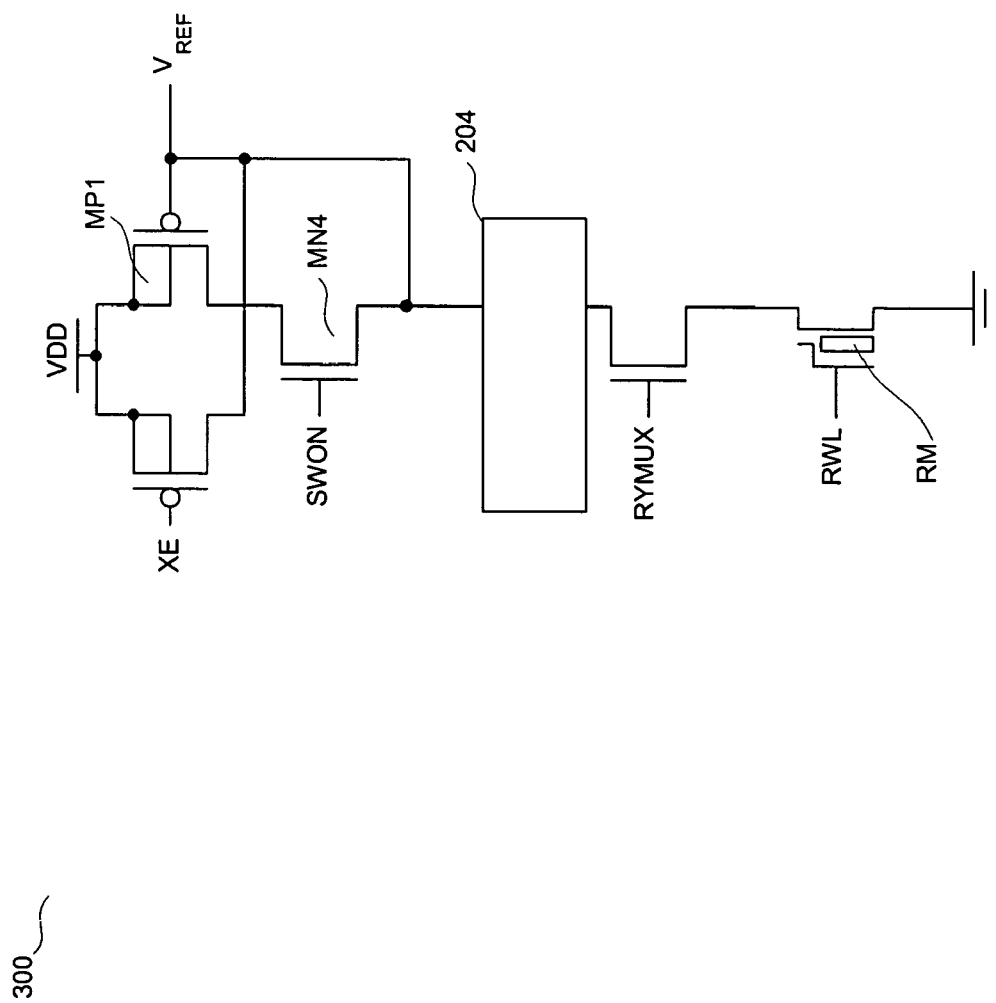
FIG. 3 illustrates a block diagram of a startup reference voltage generator in accordance with one example of the present disclosure.

FIG. 3 illustrates a startup bias reference voltage generator (SBRVG) 300 in accordance with one example of the present disclosure. The SBVG 300 is similar to the bias reference voltage generator 202 but with two defined exceptions. First, the drain of transistor MP1 is connected to the drain of an nMOS transistor MN4, whose source shares with the regular bias reference voltage generator at a common point for producing $V_{REF}$. MP1 allows for additional control for the use of this SBRVG 300 as the gate of transistor MN4 is connected to a startup control signal SWON. This startup control signal only allows this SBRVG to operate at the beginning of the reading cycle to help $V_{REF}$ to discharge quickly to a predetermined level, and will shut off the SBRVG when there is no such need any more. In essence, when SWON is set to "1", transistor MN4 conducts, thereby current flows through transistor MN4 as well as transistors of the reference memory cell. When SWON is set to "0", transistor MN4 no longer conducts, thereby preventing current from flowing underneath the transistor MN4.

The size of transistor MP1 and the reference memory cell RM may be adjusted to allow more current to pass down to the reference memory cell RM of the startup reference voltage generator 300. As the size of both elements increases, current along the reference memory cell RM increases, thereby allowing faster discharge. For example, it is very easy to design such a SBRVG with this MP1 being several times bigger than an equivalent transistor in the regular BRVG.

Figure 4:
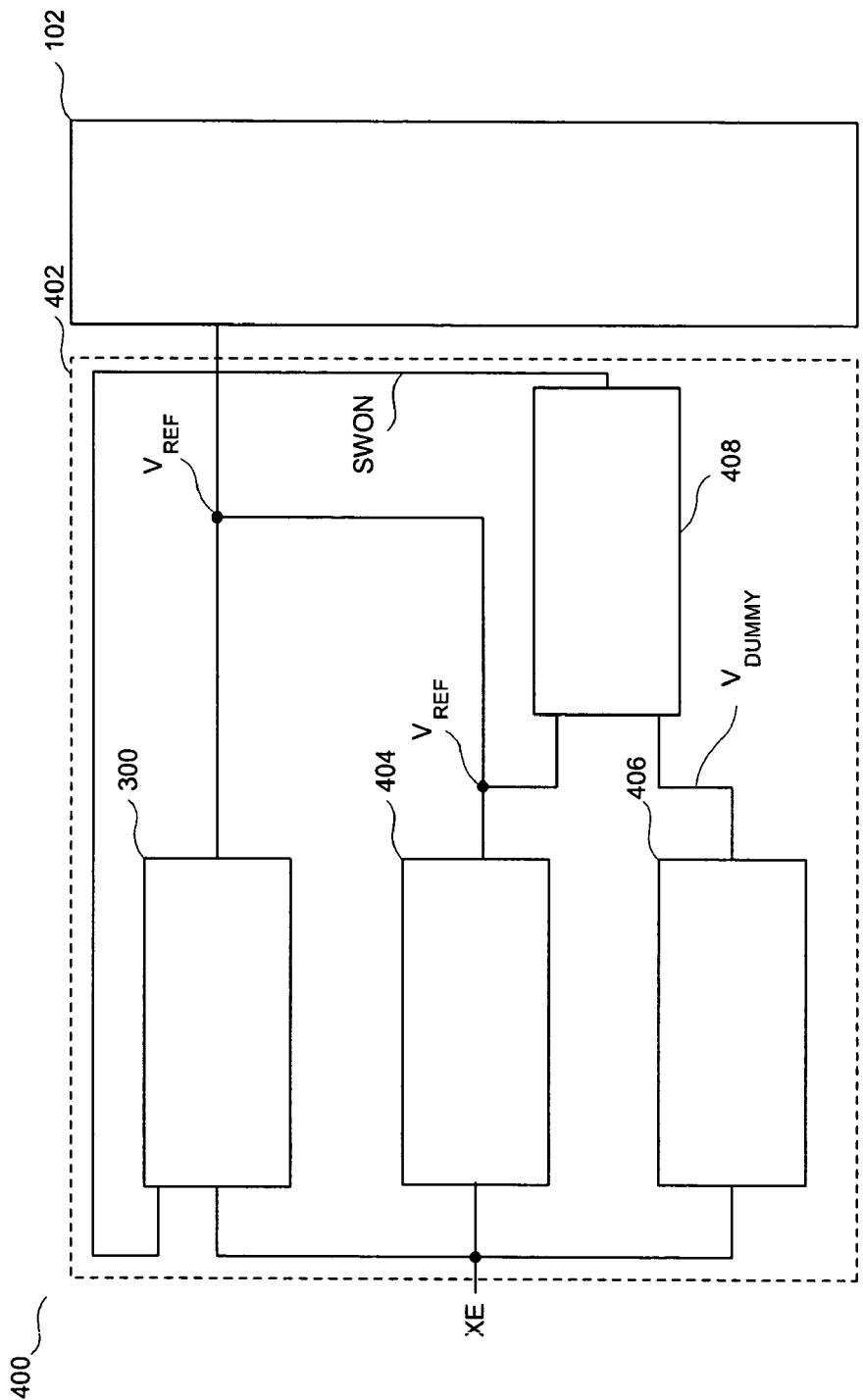
FIG. 4 illustrates a memory device with an improved reference voltage generator circuit in accordance with one example of the present disclosure.

FIG. 4 illustrates a memory device 400 with the improved sensing circuit in accordance with one example of the present disclosure. With references to FIGS. 1 to 3, the memory device 400 includes a bias reference voltage generator circuit (BRVGC) 402 and a memory array 102. The BRVGC 402 includes a startup bias reference voltage generator (SBRVG) 300 as described in FIG. 3, a regular bias reference voltage generator (BRVG) 404, a dummy or monitor reference voltage generator (MRVG) 406 and a comparison module 408. The regular BRVG 404 is coupled to the memory array 102, and experiences certain capacitance load. The dummy reference voltage generator 406 is structurally equivalent to the BRVG 404, except that the dummy reference voltage generator 406 is not connected to the memory array 102, thereby having no capacitance load.

The comparison module 408 compares the reference voltages coming out from both the MRVG and BRVG and sends a startup control signal SWON to control the startup bias reference voltage generator 300. When SWON is set at "1", the startup reference voltage generator 300 turns on. Since the current in the startup reference voltage generator 300 is high, $V_{REF}$ discharges faster in this configuration since the SBRVG 300 contributes a significant amount of discharge current in order to "settle" $V_{REF}$.

Figure 5:
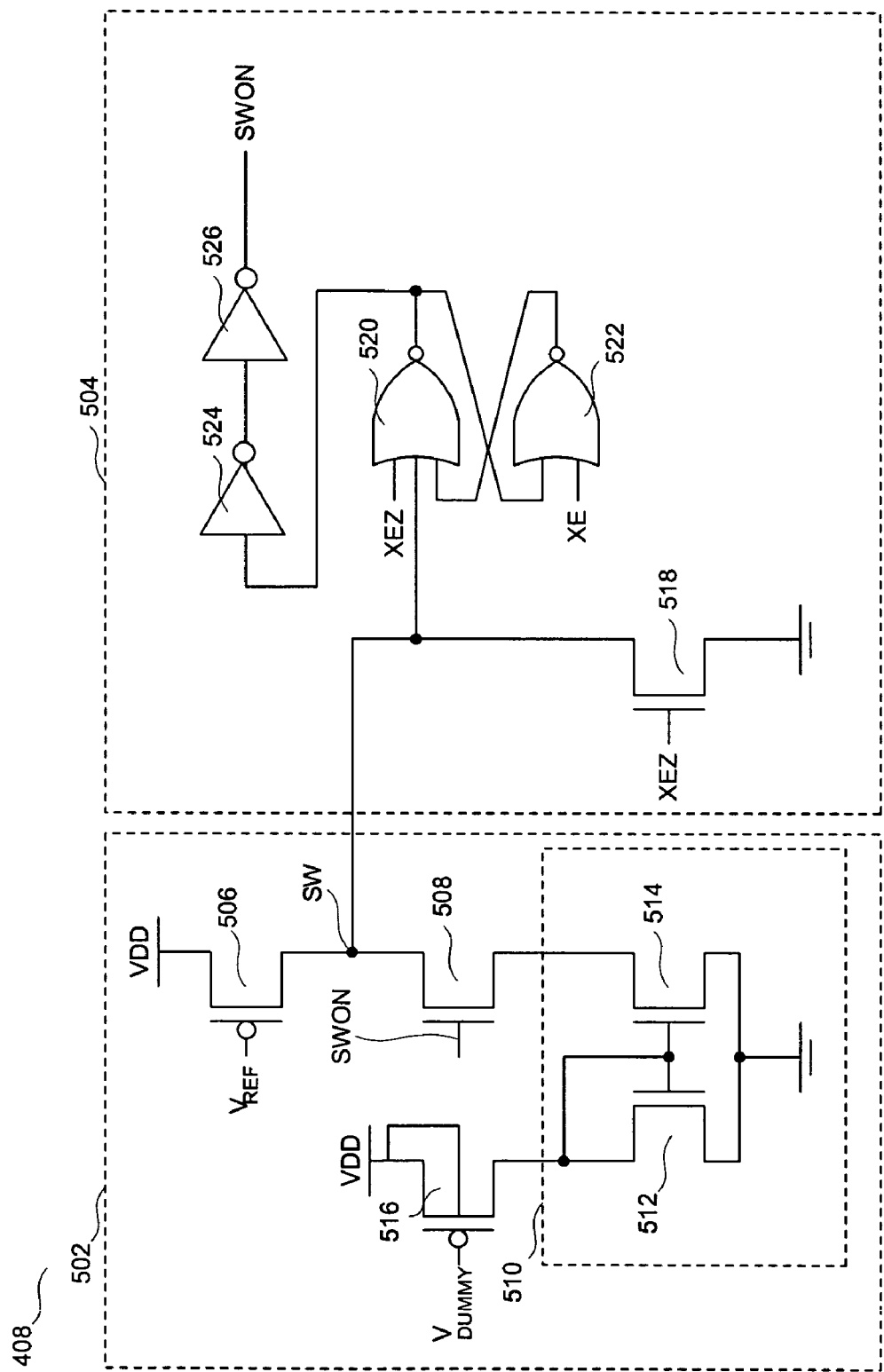
FIG. 5 illustrates a startup controller in accordance with one example of the present disclosure.

FIG. 5 illustrates the comparison module 408 of FIG. 4 in accordance with one example of the present disclosure. The startup controller 408 includes a stability detector 502 and a startup control module 504. The stability detector 502 is to compare whether the reference voltage generated by the regular BRVG matches the quickly discharged reference voltage produced by the no-load MRVG. It includes a current mirror type of circuit which includes a pMOS transistor 506, whose source is connected to VDD and whose gate is connected to $V_{REF}$ of the BRVG 404. The drain of transistor 506 is connected, through a node SW, to the drain of an nMOS transistor 508, whose gate is connected to the control signal SWON. The source of transistor 508 is connected to one side of a current mirror circuit 510, which includes two nMOS transistors 512 and 514, whose gates are connected together and whose sources are connected to VSS. The drain of transistor 512 is connected to the drain of a pMOS transistor 516, whose gate is connected to $V_{DUMMY}$ of the MRVG 406. The drain of transistor 512 is further connected to its gate, while the source of transistor 508 connects to the current mirror module 510 at the drain of transistor 514. Typically, the current mirror module is connected to VSS and is further connected to ground. It is noticed that NMOS transistor 506 is preferred to have a bigger size than the one 516 in the MRVG.

The startup control module 504 includes an nMOS transistor 518, whose drain, source and gate are respectively connected to the node SW, VSS and the inverse of XE, or XEZ. The node SW is further connected to one input terminal of a three-input NOR gate 520, whose other two inputs are XEZ and the output of a two-input NOR gate 522. The two inputs of the NOR gate 522 are XE and the output of NOR gate 520. The output of NOR gate 520 is further connected to a series of two inverters 524 and 526, the latter of which outputs the control signal SWON.

By controlling the value of XE, an appropriate startup control signal SWON can be generated. When $V_{REF}$ is still discharging and not ready, SW will remain at "0", and all three inputs to NOR gate 520 are "0", thereby pulling the output of NOR gate 520 to "1" and then SWON to "1". When SWON is set at "1", transistor MN4 of startup reference voltage generator 300 conducts, thereby allowing the startup reference voltage generator 300 to discharge.

In a reading cycle, when the bias reference voltage $V_{REF}$ needs to change quickly enough to get ready, and since the MRVG 406 has no load, it discharges faster. When $V_{REF}$ is deemed to be equivalent to $V_{DUMMY}$, the stability circuit 502 pulls SW to "1". As SW is pulled to "1", the output of NOR gate 420 is set to "0", thereby setting SWON to "0". SW remains floating at "1" after SWON is set to "1" and until XE is set to "0". At this point, the SBRVG has fulfilled its function and does not need to operate any longer for the reading cycle. Afterwards, $V_{REF}$ can be maintained by the regular BRVG alone. Also, while SWON is set to "1", the current mirror circuit 410 ensures that $V_{REF}$ and $V_{DUMMY}$ are stable enough such that any output will be latched properly without the possibility of an erroneous data read operation. It is understood by those skilled in the art that this output may be latched by a variety of latching mechanisms.

In order to ensure that SW is successfully pulled to "1", the size of transistor 506 may be designed to be slightly larger than the size of transistor 516 such that enough current can flow through the transistor to pull SW to VDD. For example, an increase by a factor of 1.1 to 1.2 may be enough to pull SW to greater than the trip point of NOR gate 520.

Figure 6:
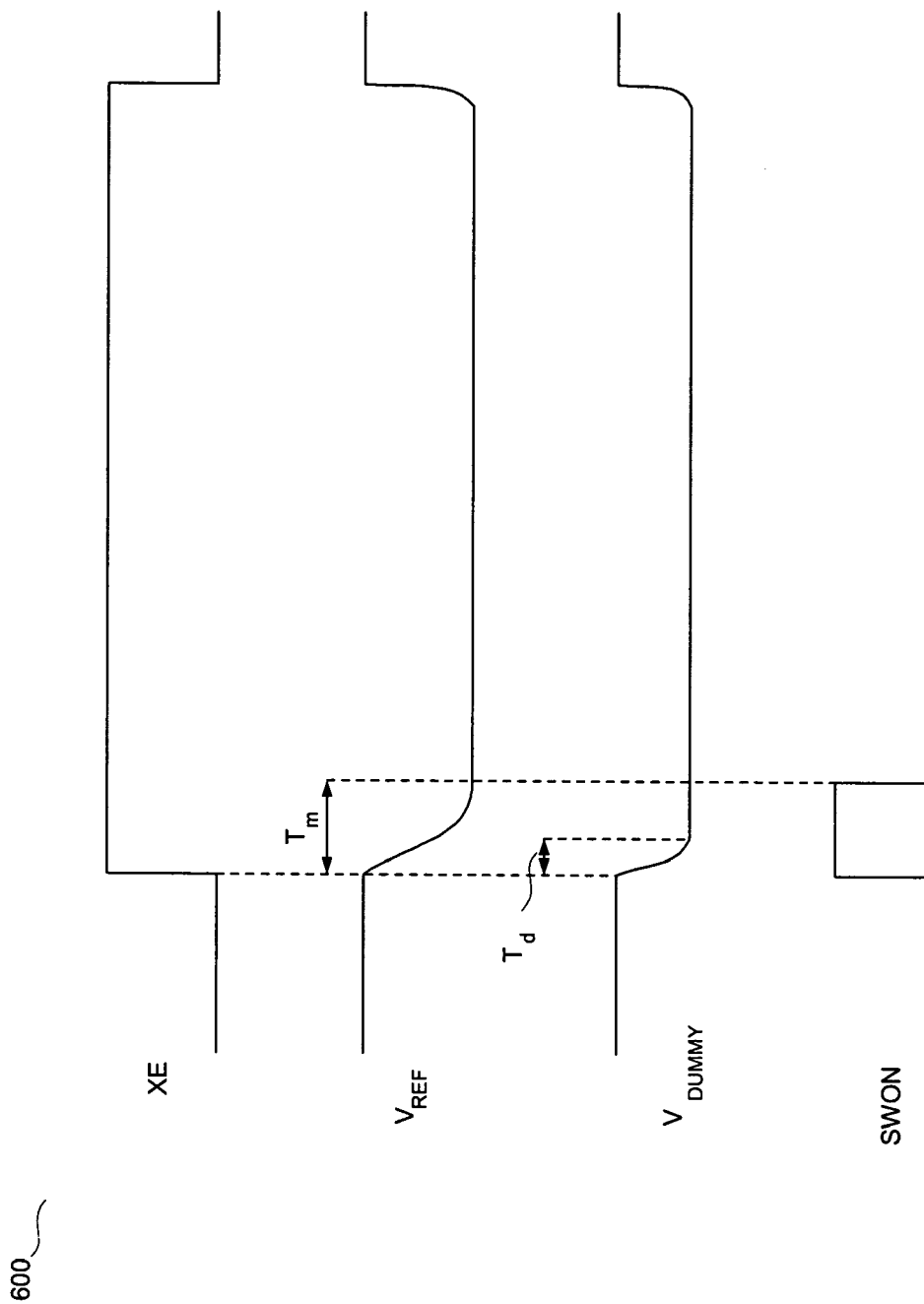
FIG. 6 illustrates a timing diagram of the improved reference voltage generator in accordance with one example of the present disclosure.

FIG. 6 illustrates a timing diagram 600 of the improved circuit in accordance with one example of the present disclosure. As XE is set to "1", both $V_{REF}$ and $V_{DUMMY}$ begin to discharge to their appropriate levels. At this point, SWON is also set to "1". Since the MRVG 406 is not connected to the memory array 102, thereby facing no capacitance load, $V_{DUMMY}$ discharges to the appropriate level much faster, as represented by the period $T_d$. With reference to both FIGS. 5 and 6, once $V_{REF}$ discharges to an appropriate level after a period $T_m$, $V_{REF}$ is deemed to be ready. With the help of the SBRVG 300, the discharge time of the regular BRVG 404 is improved because the SBRVG takes extra current for the discharge of $V_{REF}$. Once SWON is set to "0", no current will flow below transistor MN4 of the SBRVG 300, thereby saving some power. From a memory I/O perspective, power will also be significantly reduced because by reducing discharging time, memory can be read safely much earlier, thereby allowing the circuit to turn "off" earlier without significant waste of power.

The above disclosure provides many different embodiments, or examples, for implementing different features of the disclosure. Specific examples of components, and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. A sense amplifier reference voltage generator circuit for nonvolatile memory devices, comprising:
   at least one sense amplifier bias reference voltage generator (SABRVG) for generating a reference voltage at a reference node;
   a start-up bias reference voltage generator (SBRVG) coupled to the SABRVG at the reference point;
   a monitor reference voltage generator (MRVG) for generating a monitor reference voltage; and
   a comparison module for comparing the monitor reference voltage with the reference voltage to produce a start-up control signal,
   wherein the SBRVG enhances a discharging speed of the reference voltage during a reading cycle of the nonvolatile memory and when the monitor reference voltage and the reference voltage are matched, the start-up control signal stops the SBRVG from operating, thereby having the SABRVG maintain the reference voltage.

2. The circuit of claim 1 wherein the start-up bias reference voltage generator includes:
a pull-up pMOS transistor;
a first nMOS transistor for functioning as a reference memory cell with its gate controlled by a wordline control signal;
a second nMOS transistor connected in series with the first nMOS transistor with its gate controlled by a bitline control signal; and
a control module coupled between the pull-up pMOS transistor and the second nMOS transistor for turning on the SBRVG under a control of the start-up control signal.

3. The circuit of claim 2 wherein the control module further includes:
a third NMOS transistor with a negative feedback connected in series with the second nMOS transistor; and
a fourth nMOS transistor with its gate controlled by the start-up control signal and connected in series with the third nMOS transistor and the pull-up pMOS transistor.

4. The circuit of claim 1 wherein the SABRVG further includes:
a first and second pull-up pMOS transistors connected in parallel with a gate of the first pull-up pMOS transistor being controlled by a control signal and a drain of the second pull-up pMOS transistor generating the reference voltage;
a first nMOS transistor for functioning as a reference memory cell with its gate controlled by a wordline control signal;
a second nMOS transistor connected in series with the first nMOS transistor with its gate controlled by a bitline control signal; and
a third nMOS transistor with a negative feedback connected in series with the second NMOS transistor and the pull-up pMOS transistor,
wherein the reference voltage is coupled to one or more input/output modules of the nonvolatile memory.

5. The circuit of claim 4 wherein the comparison module has a current mirror type circuit for comparing the monitor reference voltage and the reference voltage and for producing the start-up control signal when enabled by the control signal.

6. The circuit of claim 1 wherein the MRVG further includes:
a first and second pull-up pMOS transistors connected in parallel with the gate of the first pull-up pMOS transistor being controlled by a control signal and the gate of the second pull-up pMOS transistor generating the monitor reference voltage;
a first nMOS transistor for functioning as a monitor memory cell with its gate controlled by a wordline control signal;
a second NMOS transistor connected in series with the first nMOS transistor with its gate controlled by a bitline control signal; and
a third nMOS transistor with a negative feedback connected in series with the second nMOS transistor and the pull-up pMOS transistors,
wherein the monitor reference voltage is not coupled to any input/output module of the nonvolatile memory.

7. The circuit of claim 1 wherein the SBRVG dissipates more current than the SABRVG at the beginning of the reading cycle.

8. A reference voltage generator circuit for nonvolatile memory devices, comprising:
at least one bias reference voltage generator (BRVG) for generating a reference voltage at a predetermined reference node thereof;
a start-up bias reference voltage generator (SBRVG) coupled to the reference node, the SBRVG further comprising:
a first pull-up pMOS transistor;
a first NMOS transistor for functioning as a reference memory cell with its gate controlled by a wordline control signal;
a second nMOS transistor connected in series with the first nMOS transistor with its gate controlled by a bitline control signal; and
a control module coupled between the first pull-up pMOS transistor and the second nMOS transistor for turning on the SBRVG under a control of a start-up control signal;
a monitor reference voltage generator (MRVG) for generating a monitor reference voltage; and
a comparison module for comparing the monitor reference voltage with the reference voltage to produce the start-up control signal,
wherein the SBRVG enhances a discharging speed of the reference voltage and when the monitor reference voltage and the reference voltage are matched, the start-up control signal stops the SBRVG from operating, thereby having the BRVG maintain the reference voltage.

9. The circuit of claim 8 wherein the BRVG further includes:
a second and third pull-up pMOS transistors connected in parallel with its gate of the second pull-up pMOS transistor being controlled by a control signal and its drain of the third pull-up pMOS transistor generating the reference voltage;
a third NMOS transistor for functioning as a reference memory cell with its gate controlled by a wordline control signal;
a fourth nMOS transistor connected in series with the third nMOS transistor with its gate controlled by a bitline control signal; and
a fifth nMOS transistor with a negative feedback connected in series with the fourth nMOS transistor and the pull-up pMOS transistors,
wherein the reference voltage is coupled to one or more input/output modules of the nonvolatile memory.

10. The circuit of claim 9 wherein the comparison module has a current mirror type circuit for comparing the monitor reference voltage and the reference voltage and for producing the start-up control signal when enabled by the control signal.

11. The circuit of claim 9 wherein the MRVG further includes:
a fourth and fifth pull-up pMOS transistors connected in parallel with the gate of the fourth pull-up pMOS transistor being controlled by the control signal and the gate of the fifth pull-up pMOS transistor generating the monitor reference voltage;
a sixth nMOS transistor for functioning as a monitor memory cell with its gate controlled by a wordline control signal;
a seventh nMOS transistor connected in series with the sixth nMOS transistor with its gate controlled by a bitline control signal; and a eighth nMOS transistor with a negative feedback connected in series with the seventh nMOS transistor and the pull-up pMOS transistors,
wherein the monitor reference voltage is not coupled to any input/output module of the nonvolatile memory.

12. The circuit of claim 11 wherein the first pull-up pMOS transistor is a transistor larger than the similarly situated third and fifth pull-up pMOS transistors so that the SBRVG dissipates more current than the BRVG at the beginning of the reading cycle.

13. The circuit of claim 11 wherein the control module further includes:
a ninth nMOS transistor with a negative feedback connected in series with the second nMOS transistor; and
a tenth nMOS transistor with its gate controlled by the start-up control signal and connected in series with the ninth nMOS transistor and the pull-up pMOS transistors.

14. A method for enhancing reference voltage discharging speed during a reading cycle of a nonvolatile memory device, the method comprising:
generating a bias reference voltage at a reference point by at least one sense amplifier bias reference voltage generator (SABRVG);
enhancing the discharging speed of the bias reference voltage by coupling the reference point with a start-up bias reference voltage generator (SBRVG), the SBRVG further comprising:
a first pull-up pMOS transistor;
a first nMOS transistor for functioning as a reference memory cell with its gate controlled by a wordline control signal;
a second nMOS transistor connected in series with the first nMOS transistor with its gate controlled by a bitline control signal; and
a control module coupled between the first pull-up pMOS transistor and the second nMOS transistor for turning on the SBRVG under a control of a start- up control signal;
generating a monitor reference voltage by a monitor reference voltage generator (MRVG); and
comparing the monitor reference voltage with the reference voltage to produce the start-up control signal,
wherein when the monitor reference and the reference voltages are matched, the start-up control signal stops the SBRVG from operating, thereby having the SABRVG maintain the reference voltage.

15. The method of claim 14 wherein the SABRVG further includes:
a second and third pull-up pMOS transistors connected in parallel with the gate of the second pull-up pMOS transistor being controlled by a control signal and the gate of the third pull-up pMOS transistor generating the reference voltage;
a third nMOS transistor for functioning as a reference memory cell with its gate controlled by a wordline control signal;
a fourth nMOS transistor connected in series with the third nMOS transistor with its gate controlled by a bitline control signal; and
a fifth nMOS transistor with a negative feedback connected in series with the fourth nMOS transistor and the pull-up pMOS transistors,
wherein the reference voltage is coupled to one or more input/output modules of the nonvolatile memory.

16. The method of claim 14 wherein the MRVG further includes:
a fourth and fifth pull-up pMOS transistors connected in parallel with the gate of the fourth pull-up pMOS transistor being controlled by the control signal and the gate of the fifth pull-up pMOS transistor generating the monitor reference voltage;
a sixth nMOS transistor for functioning as a monitor memory cell with its gate controlled by a wordline control signal;
a seventh NMOS transistor connected in series with the sixth nMOS transistor with its gate controlled by a bitline control signal; and
an eighth NMOS transistor with a negative feedback connected in series with the seventh nMOS transistor and the pull-up pMOS transistors,
wherein the monitor reference voltage is not coupled to any input/output module of the nonvolatile memory.

17. The method of claim 16 wherein the first pull-up pMOS transistor is a transistor larger than the similarly situated third and fifth pull-up pMOS transistors so that the SBRVG dissipates more current than the SABRVG at the beginning of the reading cycle.

* * * * *